United States Patent
Kaushik et al.

(10) Patent No.: US 6,184,072 B1
(45) Date of Patent: Feb. 6, 2001

(54) PROCESS FOR FORMING A HIGH-K GATE DIELECTRIC

(75) Inventors: Vidya S. Kaushik; Bich-Yen Nguyen; Olubunmi O. Adetutu; Christopher C. Hobbs, all of Austin, TX (US)

(73) Assignee: Motorola, Inc., Schaumburg, IL (US)

( * ) Notice: Under 35 U.S.C. 154(b), the term of this patent shall be extended for 0 days.

(21) Appl. No.: 09/571,588

(22) Filed: May 17, 2000

(51) Int. Cl.$^7$ .................................................. H01L 21/336
(52) U.S. Cl. .......................... 438/197; 438/585; 438/785; 438/786
(58) Field of Search .................................. 438/785, 786, 438/787, 197, 287, 299, 301, 585, 656

(56) References Cited

U.S. PATENT DOCUMENTS

| | | | |
|---|---|---|---|
| 4,495,219 | * | 1/1985 | Kato et al. ............................ 438/785 |
| 6,013,553 | * | 1/2000 | Wallace et al. ....................... 438/287 |
| 6,015,739 | * | 1/2000 | Gardner et al. ....................... 438/287 |
| 6,020,024 | * | 2/2000 | Maiti et al. ......................... 427/248.1 |
| 6,020,243 | * | 2/2000 | Wallace et al. ....................... 438/287 |
| 6,060,755 | * | 5/2000 | Ma et al. ............................. 257/410 |
| 6,110,784 | * | 8/2000 | Gardner et al. ....................... 438/287 |

\* cited by examiner

*Primary Examiner*—T. N. Quach
(74) *Attorney, Agent, or Firm*—James L. Clingan, Jr.

(57) ABSTRACT

A method of processing a high K gate dielectric includes growing a high quality silicon dioxide layer at the silicon interface followed by deposition of a metal layer, which is then diffused into the silicon dioxide. Preferred metals include zirconium and hafnium. A gate stack may be fabricated by adding a metal containing layer to an existing thermally grown $SiO_2$ or a combination of $SiO_2$, $SiO_3$ and $SiO_4$ (oxide-nitride or oxynitride) stacks.

2 Claims, 2 Drawing Sheets

PROCESS FOR FORMING A HIGH-K GATE DIELECTRIC

FIELD OF THE INVENTION

The present invention is related to the field of electronic devices, particularly to semiconductor devices, and more particularly to the field of processing of semiconductor devices to achieve a high K gate dielectric on a silicon substrate.

RELATED ART

As semiconductor devices become smaller there is a need for higher dielectric constant (K) gate material. It is known that many metal oxides, when deposited or grown over silicon crystal substrates provide a higher dielectric constant. However a high quality silicon dioxide layer is also desirable in order to have a good interface with a silicon substrate material. One solution to this problem has been to deposit metal oxides directly onto a silicon layer. This technique may cause problems, however, because some oxidation of the silicon occurs during the process, resulting in a silicon dioxide layer between the metal oxide and the silicon. Because the metal oxide deposition is done at low temperature this is a poor quality silicon dioxide. Therefore, a second annealing step is necessary which results in a thicker silicon dioxide interface layer, also undesirable.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

BRIEF SUMMARY OF THE INVENTION

The present disclosure provides a method of growing a high quality silicon dioxide layer at the silicon interface followed by deposition of a metal layer, which is then diffused into the silicon dioxide to create a high K dielectric layer. Recent results using metals like zirconium and hafnium have shown that adding small amounts of metal ions can change the dielectric constant of $SiO_2$. A gate stack may be fabricated by adding a metal containing layer to an existing thermally grown $SiO_2$ or a combination of $SiO_2$ and $Si_3N_4$ (silicon-oxide-nitride or silicon oxynitride) stacks. Upon heating this thin metal layer over the silicon dioxide at a suitable temperature, metal ions will diffuse into the silicon dioxide thereby increasing the dielectric constant of the gate dielectric layer. The metal may itself serve as a gate electrode or may be thickened by deposition of more metal layers. If necessary a nitrogen-containing ambient, for example, may be incorporated as part of the oxide growth to inhibit subsequent metal ion diffusion into the silicon channel.

DETAILED DESCRIPTION OF THE INVENTION

Figure 1:
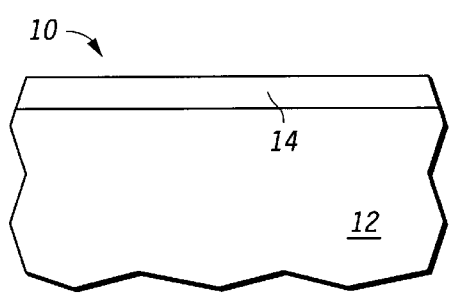
FIG. 1 illustrates a schematic cross sectional view of a semiconductor device in which an oxide layer has been grown on the silicon interface.

Shown in FIG. 1 is a typical semiconductor substrate which includes a semiconductor material 12. Semiconductor materials that may be used include a silicon, silicon germanium or other materials known in the art that would be suitable for the practice of the present invention. In the first step of the practice of the invention, a high quality silicon dioxide layer is grown on the silicon substrate. For example, as is known in the art, a silicon dioxide layer may be grown at temperatures of from about 800° C. to about 1050° C. In the practice of the invention a wet oxygen source such as steam or a dry oxygen source may be used for growing the silicon dioxide layer. In a preferred embodiment, a steam containing oxygen atmosphere may be used at high temperature in order to grow the silicon dioxide layer. In certain embodiments an oxynitride layer may be grown on the silicon substrate by providing the oxygen in a nitrogen containing atmosphere. It is contemplated that this may have certain advantages during the diffusion of metal in later steps of the process because the nitride containing layer may prevent diffusion of the metal into the silicon substrate.

Preferred metals that may be used in the practice of the invention include, but are not limited to, zirconium, hafnium, yttrium, germanium, tungsten, tantalum, and titanium. Any other material that would enhance the dielectric constant of silicon dioxide may also be useful for this purpose. A high dielectric constant forming layer may also be described as a layer that is capable of forming an oxide that is thermodynamically stable in the presence of silicon dioxide. Preferred materials include Group IVA metals and Group IIIA metals or refractory metals such as tungsten. It is also advantageous to use metals that do not form silicides under the process conditions used so that should metal diffuse enter the channel below the silicon dioxide layer, harmful silicides will not be formed. The metal is desirably thermodynamically stable with silicon oxide. In the practice of the invention, the oxide layer 14 may be grown to a thickness of from about 10 Å to about 60 Å depending upon the device to be constructed and would more preferably be in the range of from about 20 Å to 80 Å or more preferably, from about 40 Å to about 50 Å. Thickness will be chosen based on the dielectric constant of the final metal containing layer. This gate dielectric may be grown at a relatively high temperature of in excess of 850 degrees Celsius. The high temperature is advantageous because that ensures a high quality film. The metal layer 16 may be deposited by any method known in the art including a sputter or an atomic layer deposition for example, the amount of metal deposited will depend upon the dielectric constant desired as well as the particular metal chosen for the application. Metal may be deposited in layers of from about 5 Å up to about 30 Å or even 50 Å as desired. It is an aspect of the invention that during the annealing step one may achieve a concentration of from about 4% to about 15% metal within the silicon dioxide layer in order to achieve an optimal increase in dielectric constant.

Figure 2:
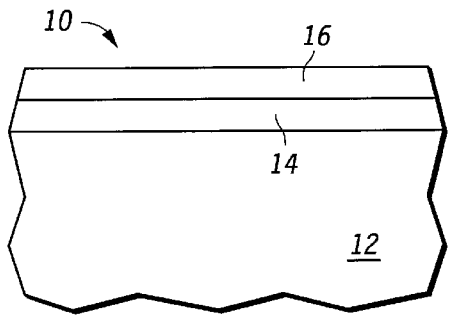
FIG. 2 illustrates a schematic cross sectional view of a semiconductor device in which a metal layer has been deposited on the silicon oxide layer.
Figure 3:
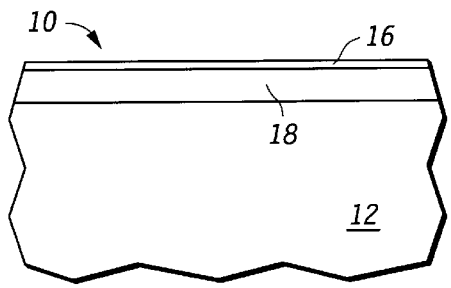
FIG. 3 illustrates a schematic cross sectional view of a semiconductor device in which the metal is being diffused into the oxide layer.
Figure 4:
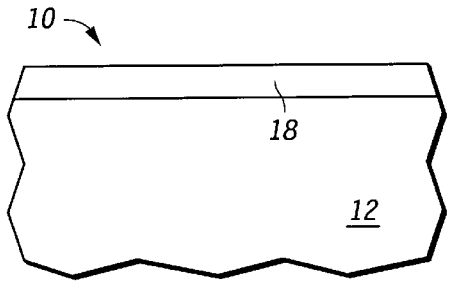
FIG. 4 illustrates a schematic cross sectional view of a semiconductor device after all the metal has been defused into the oxide layer.

Subsequent to the steps shown in FIG. 2, the device is subjected to a diffusion step in which the device is heated in order to facilitate diffusion of the metal layer into the silicon dioxide layer. The time and temperature are chosen in order to get optimal diffusion of the metal into the silicon oxide but to prevent diffusion of the metal into the silicon substrate. One would typically heat the device to a temperature of from about 400° C. up to about 800° C. for a period of time of from about 5 to about 10 minutes. It is also possible that one might use a rapid thermal anneal (RTA) at a temperature of up to about 1000° for a time of no more than 60 seconds. In the embodiment shown in FIG. 3 a silicon dioxide layer has been impregnated with metal or metal oxides to produce the impregnated High-K high dielectric layer 18. In the embodiment of FIG. 3 residual metal layer 16 remains on top of the High-K dielectric layer. In the embodiment shown in FIG. 4 all of the metal has diffused into the silicon dioxide layer to produce the metal impregnated layer 18.

Figure 5:
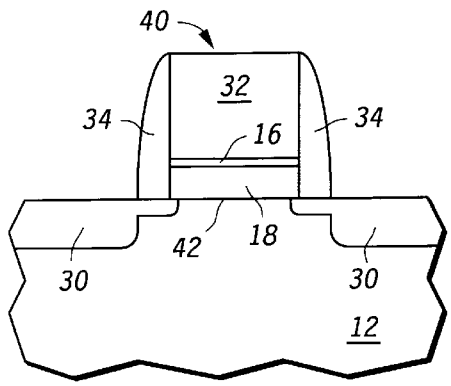
FIG. 5 illustrates a schematic cross sectional view of a semiconductor device in which a gate conductor has been produced on the device shown in FIG. 3.
Figure 6:
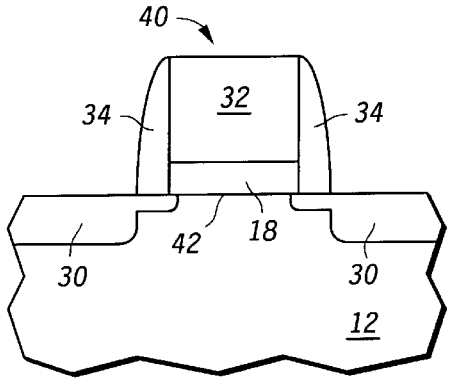
FIG. 6 illustrates a schematic cross sectional view of a semiconductor device in which a gate conductor has been produced on the device shown in FIG. 4.
Figure 7:
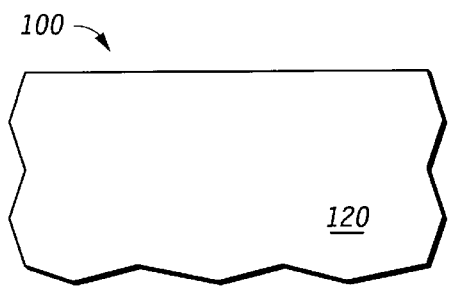
FIG. 7 illustrates a schematic cross sectional view of a semiconductor device silicon substrate.
Figure 8:
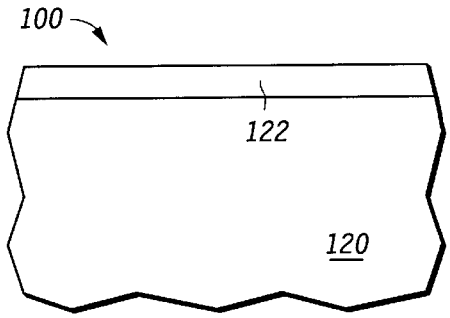
FIG. 8 illustrates a schematic cross sectional view of a semiconductor device with a metal impregnated layer at the silicon surface.

Advantages of the method disclosed herein include the ability to fabricate high quality thermal oxides to give the best silicon-silicon dioxide interface properties. In addition it requires no additional oxygen exposure thereby causing no subsequent increase in interfacial oxide thickness. It also allows the creation of a High-K silicate material with controlled quantity of metallic ions thus increasing the K value. It further provides a graded metallic content with the High-K layer which provides the best device properties. FIG. 5 illustrates the use of a semiconductor substrate manufactured by the process disclosed herein in the manufacture of a transistor device 40. The transistor device includes a silicon substrate 12 and doped source and drain regions 30 with channel 42 between source/drains 30 and under gate 32. A metal gate electrode 32 has been deposited over the High-K dielectric 18 and the residual metal layer 16. The gate electrode metal may be any metal known in the art. Also shown are spacers 34 as are typically deposited in the manufacture of semiconductor devices. When a device is made according to the embodiment shown in FIG. 4 the resulting device is as that shown in FIG. 6. In FIG. 6 no residual layer remains and the gate electrode material is deposited directly on the High-K dielectric material 18. In those embodiments such as shown in FIG. 5 it is also understood that the gate electrode material may be the same metal that was diffused into the oxide layer 16 or it may be a different metal. Source/drains 30 are formed in substrate 12 self-aligned with gate 32 and thus adjacent to gate 32.

Figure 9:
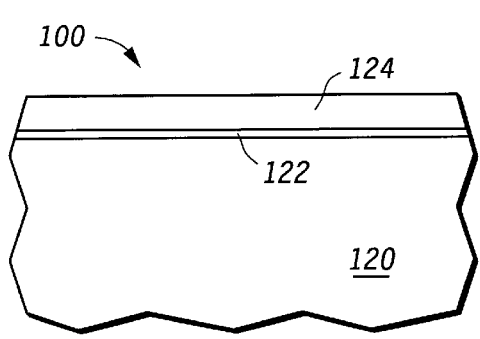
FIG. 9 illustrates a schematic cross sectional view of a semiconductor device during oxidation of a metal impregnated silicon substrate.
Figure 10:
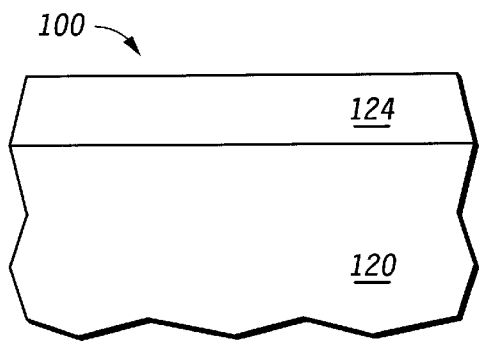
FIG. 10 illustrates a schematic cross sectional view of a semiconductor device after oxidation is complete.

An alternative method of the processes disclosed herein is shown in FIGS. 7 through 10. In this embodiment a semiconductor substrate such as a silicon crystal substrate 120 is first implanted with a layer of metal to achieve a metal impregnated layer of silicon 122 at the surface of the substrate. The metal may be deposited on the surface of the silicon and then diffused into the silicon layer or preferably the metal is implanted into the silicon. By the use of this method lower concentration of metal may be used and may be implanted with a higher degree of control. Following the metal implantation the device is subjected to a thermal anneal in an oxygen ambient atmosphere which may also contain nitrogen or steam. A device is shown in FIG. 9 in an intermediate step in which the oxidation is partially completed to produce the oxidized silicon metal containing layer 124 and the remaining un-utilized metal silicon layer 122. At the completion of the annealing step a High-K dielectric layer 124 is shown on top of the silicon substrate in FIG. 10. This substrate may then be used to manufacture the device as shown in FIG. 5.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method of forming a transistor on a substrate having a semiconductor surface, comprising the steps of:

implanting a metal into the first portion of the surface;

applying oxygen to the first portion of the surface to grow an oxide of the metal and the semiconductor surface;

forming a gate conductor over the first portion of the surface; and forming a source and drain in the semiconductor surface adjacent to the gate to leave a channel between the source and drain and under the gate conductor.

2. The method of claim 1, wherein the semiconductor surface is silicon and the metal is selected from hafnium and zirconium.

* * * * *